(12) United States Patent  (10) Patent No.: US 7,880,307 B2
Farnworth et al.  (45) Date of Patent: Feb. 1, 2011

(54) SEMICONDUCTOR DEVICE INCLUDING THROUGH-WAFER INTERCONNECT STRUCTURE

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 12/186,913

(22) Filed: Aug. 6, 2008

(65) Prior Publication Data

US 2008/0308910 A1   Dec. 18, 2008

Related U.S. Application Data

(62) Division of application No. 11/198,338, filed on Aug. 5, 2005, now Pat. No. 7,429,529.

(51) Int. Cl.
*H01L 23/52* (2006.01)
*H01L 29/40* (2006.01)

(52) U.S. Cl. ............... 257/774; 257/781; 257/E23.011; 257/E21.085; 438/667

(58) Field of Classification Search .......... 257/E21.085, 257/E23.011, 774, 781; 438/667
See application file for complete search history.

(56) References Cited

U.S. PATENT DOCUMENTS

| | | | |
|---|---|---|---|
| 4,074,342 | A | 2/1978 | Honn et al. |
| 4,445,978 | A | 5/1984 | Whartenby et al. |
| 4,806,111 | A | 2/1989 | Nishi et al. |
| 5,063,177 | A | 11/1991 | Geller et al. |
| 5,166,097 | A | 11/1992 | Tanielian |
| 5,229,647 | A | 7/1993 | Gnadinger |
| 5,236,551 | A | 8/1993 | Pan |
| 5,269,880 | A | 12/1993 | Jolly et al. |
| 5,380,681 | A | 1/1995 | Hsu |
| 5,420,520 | A | 5/1995 | Anschel et al. |

(Continued)

FOREIGN PATENT DOCUMENTS

EP           0 926 723 A1    6/1999

OTHER PUBLICATIONS

Chu et al., Laser Micromachining of Through Via Interconnects in Active Die for 3-D Multichip Module, IEEE/CMPT Int'l EMT Symposium, 1995, pp. 120-126.

(Continued)

*Primary Examiner*—Asok K Sarkar
(74) *Attorney, Agent, or Firm*—Traskbritt (57) ABSTRACT

Semiconductor devices including through-wafer interconnects are disclosed. According to an embodiment of the present invention, a semiconductor device may comprise a substrate having a first surface and a second, opposing surface, and a through-wafer interconnect extending into the first surface of the substrate. The through-wafer interconnect may include an electrically conductive material extending from the first surface of the substrate to the second, opposing surface of the substrate. The through-wafer interconnect may also include a first dielectric material disposed between the electrically conductive material and the substrate and extending from the second, opposing surface of the substrate to the first portion of the conductive material. Additionally, the through-wafer interconnect may include a second dielectric material disposed over a portion of the electrically conductive material and exhibiting a surface that defines a blind aperture extending from the first surface toward the second, opposing surface.

13 Claims, 5 Drawing Sheets

U.S. PATENT DOCUMENTS

| | | | |
|---|---|---|---|
| 5,426,072 A | 6/1995 | Finnila |
| 5,438,212 A | 8/1995 | Okaniwa |
| 5,483,741 A | 1/1996 | Akram et al. |
| 5,495,667 A | 3/1996 | Farnworth et al. |
| 5,528,080 A | 6/1996 | Goldstein |
| 5,541,525 A | 7/1996 | Wood et al. |
| 5,559,444 A | 9/1996 | Farnworth et al. |
| 5,592,736 A | 1/1997 | Akram et al. |
| 5,607,818 A | 3/1997 | Akram et al. |
| 5,686,317 A | 11/1997 | Akram et al. |
| 5,796,264 A | 8/1998 | Farnworth et al. |
| 5,841,196 A | 11/1998 | Gupta et al. |
| 5,843,844 A | 12/1998 | Miyanaga |
| 6,013,948 A | 1/2000 | Akram et al. |
| 6,018,196 A | 1/2000 | Noddin |
| 6,022,797 A | 2/2000 | Ogasawara et al. |
| 6,054,377 A | 4/2000 | Filipiak et al. |
| 6,080,664 A | 6/2000 | Huang et al. |
| 6,110,825 A | 8/2000 | Mastromatteo et al. |
| 6,114,240 A | 9/2000 | Akram et al. |
| 6,214,716 B1 | 4/2001 | Akram |
| 6,221,769 B1 | 4/2001 | Dhong et al. |
| 6,355,181 B1 | 3/2002 | McQuarrie |
| 6,400,172 B1 | 6/2002 | Akram et al. |
| 6,410,431 B2 | 6/2002 | Bertin et al. |
| 6,410,976 B1 | 6/2002 | Ahn |
| 6,420,209 B1 | 7/2002 | Siniaguine |
| 6,458,696 B1 | 10/2002 | Gross |
| 6,479,382 B1 | 11/2002 | Naem |
| 6,541,280 B2 | 4/2003 | Kaushik et al. |
| 6,620,731 B1 | 9/2003 | Farnworth et al. |
| 6,667,551 B2 | 12/2003 | Hanaoka et al. |
| 6,712,983 B2 | 3/2004 | Zhao et al. |
| 6,716,737 B2 | 4/2004 | Plas et al. |
| 6,770,923 B2 | 8/2004 | Nguyen et al. |
| 6,809,421 B1 | 10/2004 | Hayasaka et al. |
| 6,821,877 B1 | 11/2004 | Han |
| 6,841,883 B1 | 1/2005 | Farnworth et al. |
| 6,844,241 B2 | 1/2005 | Halahan et al. |
| 6,846,725 B2 | 1/2005 | Nagarajan et al. |
| 6,852,621 B2 | 2/2005 | Hanaoka et al. |
| 6,979,652 B2 | 12/2005 | Khan et al. |
| 7,001,825 B2 | 2/2006 | Halahan et al. |
| 7,029,937 B2 | 4/2006 | Miyazawa |
| 7,109,060 B2 | 9/2006 | Fukazawa |
| 7,109,068 B2 | 9/2006 | Akram et al. |
| 7,135,762 B2 | 11/2006 | Yamaguchi |
| 2002/0115290 A1* | 8/2002 | Halahan et al. ............ 438/667 |
| 2004/0080040 A1 | 4/2004 | Dotta et al. |
| 2004/0192033 A1 | 9/2004 | Hara |
| 2004/0207089 A1 | 10/2004 | Masuda |
| 2004/0217483 A1 | 11/2004 | Hedler et al. |
| 2005/0006768 A1 | 1/2005 | Narasimhan et al. |
| 2005/0121768 A1 | 6/2005 | Edelstein et al. |
| 2005/0199973 A1 | 9/2005 | Benzel et al. |
| 2006/0043599 A1 | 3/2006 | Akram et al. |
| 2006/0170110 A1 | 8/2006 | Akram et al. |
| 2008/0150089 A1 | 6/2008 | Kwon et al. |

OTHER PUBLICATIONS

Lee et al., Laser Created Silicon Vias for Stacking Dies in MCMs, EMT Symposium, 1991, Tampa, Florida, pp. 262-265.

International Search Report from PCT/US2006/030167, dated Nov. 16, 2005, 4 pages.

* cited by examiner

SEMICONDUCTOR DEVICE INCLUDING THROUGH-WAFER INTERCONNECT STRUCTURE

CROSS-REFERENCE TO RELATED APPLICATION

This application is a divisional of application Ser. No. 11/198,338, filed Aug. 5, 2005, now U.S. Pat. No. 7,429,529, issued Sep. 30, 2008. The disclosures of the previously referenced U.S. patent application and patent are hereby incorporated by reference in their entirety.

BACKGROUND OF THE INVENTION

1. Field of the Invention

The present invention relates generally to semiconductor manufacturing techniques and methods of forming electrical contacts in semiconductor substrates. More particularly, the present invention relates to methods of forming through-wafer interconnects in semiconductor substrates and structures resulting therefrom.

2. State of the Art

Semiconductor substrates often have vias extending therethrough, wherein the vias are filled with conductive materials to form interconnects (commonly known as a through-wafer interconnect, or "TWI") used, for example, to connect circuitry on one surface of the semiconductor device to circuitry on another surface thereof, or to accommodate connection with external circuitry.

As used herein, a "via" refers to a hole or aperture having conductive material or a conductive member therein and which extends substantially through a substrate (e.g., from one surface substantially to another opposing surface). The via may be used to accommodate electrical connection of a semiconductor device, an electrical component, or circuitry located on a side of the substrate other than where bond pads have been formed. Vias are conventionally formed in a variety of substrates for a variety of uses. For example, interposers for single die packages, interconnects for multi-die packages, and contact probe cards for temporarily connecting semiconductor dice to a test apparatus often employ vias in their structures.

In a more specific example, a test apparatus may be configured for the temporary and simultaneous connection of bond pads of a semiconductor die (e.g., on a full or partial wafer test apparatus). A substrate, employed as a test interposer, may include vias passing therethrough providing a pattern of conductive interconnect structures on one side of the interposer substrate to match the bond pad patterns of the semiconductor dice, as well as a plurality of interconnect structures on an opposing side of the interposer substrate for connection with the test apparatus. Thus, the vias of the interposer substrate provide electrical interconnection between the semiconductor dice (or other device) and the test apparatus.

Where a via is to be formed through a semiconductive material such as silicon, one known method for constructing the via includes forming a first hole (sometimes referred to as a "precursor hole") by a so-called "trepan" process, wherein a very small bit of a router or drill is rotated about a longitudinal axis while being moved radially about the axis to create the precursor hole. The precursor hole is larger in diameter than the intended diameter of the completed via. Following precursor hole formation, an insulation (or dielectric) layer is formed in the hole by either forming a thin silicon oxide layer on the hole's surface by exposure to an oxidizing atmosphere or by oxidizing the hole and then coating it with an insulative polymeric material. When a polymeric insulative material coating is desired, a suitable polymer, such as PARYLENE™ polymer, may be vapor deposited over the substrate and into each precursor hole on one side thereof while applying a negative pressure (i.e., a vacuum) to an opposing end of the hole. In some cases, because adhesion of a given polymer material to the silicon may be relatively poor, the surface of the hole may be oxidized to improve adhesion of the polymer material.

The insulative polymeric material is drawn into and fills each precursor hole and the polymer is cured. A via hole is drilled (such as by percussion drill or laser) or otherwise formed in the hardened insulative polymeric material so as to exhibit a diameter smaller than that of the precursor hole. The via hole is then filled with a conductive material, which conventionally includes a metal, metal alloy, or metal-containing material, to provide a conductive path between the opposing surfaces of the substrate. The conductive material of the via is insulated from the substrate itself by the layer or layers of insulative polymeric material.

While such a method provides adequate structures for enabling electrical interconnection from one surface of a substrate to another surface of the substrate, it is noted that it is difficult to achieve dense spacing of vias and difficult to form vias exhibiting high aspect ratios (i.e., height to width, or cross-sectional dimension ratios) using such a method.

In another prior art method of forming a via, a silicon wafer is provided with a thin layer of silicon dioxide on both major, opposing surfaces. A pattern is formed on the wafer by use of mask layers which prevent etching in non-via areas. An etchant is applied to both major surfaces to form holes or "feedthroughs" which meet in the middle of the wafer. A dielectric layer is then formed over the wafer surfaces including the feedthrough side walls. A metal layer is formed over the dielectric layer and conductive material is placed in the feedthroughs to complete the conductive vias. It is noted that, in order to isolate each via, the metal layer must be configured to cover the feedthrough surfaces only, or be subsequently removed from the outer surfaces of the via and wafer. Again, it is difficult to obtain high aspect ratio vias using such conventional methods and, therefore, provide a high level of density of such vias for a given application.

Other prior art methods for forming vias are generally illustrated in U.S. Pat. No. 5,166,097 to Tanielian, U.S. Pat. No. 5,063,177 to Geller et al., and U.S. Pat. No. 6,400,172 to Akram et al.

It is a continuing desire to improve the manufacturing techniques and processes used in semiconductor fabrication. It would be advantageous to provide a more efficient method for forming through-wafer interconnects that enables a higher density of vias, enables the fabrication of high aspect ratio TWI structures and improves the simplicity of the fabrication process while maintaining or improving the reliability of the TWI structures.

BRIEF SUMMARY OF THE INVENTION

The present invention discloses methods for forming conductive vias, herein also known as through-wafer interconnects (TWIs), in substrates and the resulting semiconductor devices, electrical components and assemblies including TWI structures.

In one embodiment, a method of forming a through-wafer interconnect comprises forming an aperture in a first surface of a substrate, depositing a first dielectric layer on an inner surface of the aperture, depositing an electrically conductive layer over the first dielectric layer, depositing a second dielectric layer on the inner surface of the aperture, and exposing a portion of the electrically conductive layer through the second, opposing surface of the substrate.

In accordance with another aspect of the present invention, another method is provided for forming through-wafer interconnect structures. The method includes forming an aperture in a first surface of the substrate, depositing a first dielectric layer on an inner surface of the aperture, depositing a conductive layer over the first dielectric layer, depositing a second dielectric layer over the first surface and at least a portion of the electrically conductive layer, and removing the second dielectric layer from the first surface of the substrate such that the second dielectric layer remains over at least a portion of the electrically conductive layer. A portion of the first dielectric layer is exposed through a second surface of the substrate and a third dielectric layer is disposed over the opposing, second surface of the substrate and the exposed portion of the first dielectric layer. A portion of the third dielectric layer is removed to expose a portion of the first dielectric layer through a remaining portion of the third dielectric layer. The exposed portion of the first dielectric layer is removed thereby exposing a portion of the electrically conductive layer through the second, opposing surface of the substrate and the remaining portion of the third dielectric layer.

In accordance with another aspect of the present invention, a semiconductor device is provided. The semiconductor device comprises a substrate having a first surface and a second, opposing surface, and a through-wafer interconnect extending into the first surface of the substrate. The through-wafer interconnect includes an electrically conductive material extending from the first surface of the substrate to the second, opposing surface of the substrate, wherein a first portion of the electrically conductive material is exposed through the first surface of the substrate and a second portion of the electrically conductive material is exposed through the second, opposing surface of the substrate. A first dielectric material is disposed between the electrically conductive material and the substrate and extends from the second, opposing surface of the substrate to the first portion of the conductive material. A second dielectric material is disposed over a portion of the electrically conductive material and exhibits a surface that defines a blind aperture extending from the first surface toward the second, opposing surface.

BRIEF DESCRIPTION OF THE SEVERAL VIEWS OF THE DRAWINGS

In the drawings, which depict nonlimiting embodiments of various features of the present invention, and in which various elements are not necessarily to scale.

DETAILED DESCRIPTION OF THE INVENTION

In the present invention, semiconductor wafers or portions thereof, substrates and components in which a conductive via or through-wafer interconnect (TWI) is to be formed are identified herein as "substrates" regardless of the purpose of the TWI or material of construction of the substrate or TWI. Thus, for example, the term "substrate" may be used in reference to semiconductor wafers, semiconductor wafer portions, other bulk semiconductor substrates, semiconductor devices, interposers, probe test cards, and the like. The invention is described as generally applied to the construction of a semiconductor substrate. Methods of making the TWIs in semiconductor devices are described, as well as the resulting structures, components and assemblies so made.

The methods of forming the TWIs and the resulting structures benefit from the use of lower temperature processes than conventional methods since some of the methods disclosed herein use polymers that are used at ambient temperatures. Further, some of the methods of forming the TWIs of the present invention do not require venting for a hot solder process and no flux clean is required because no solder fill process is required. Additionally the methods described herein enable the fabrication of high aspect ratio TWIs which may or may not be filled with an electrically conductive material.

Figure 1:
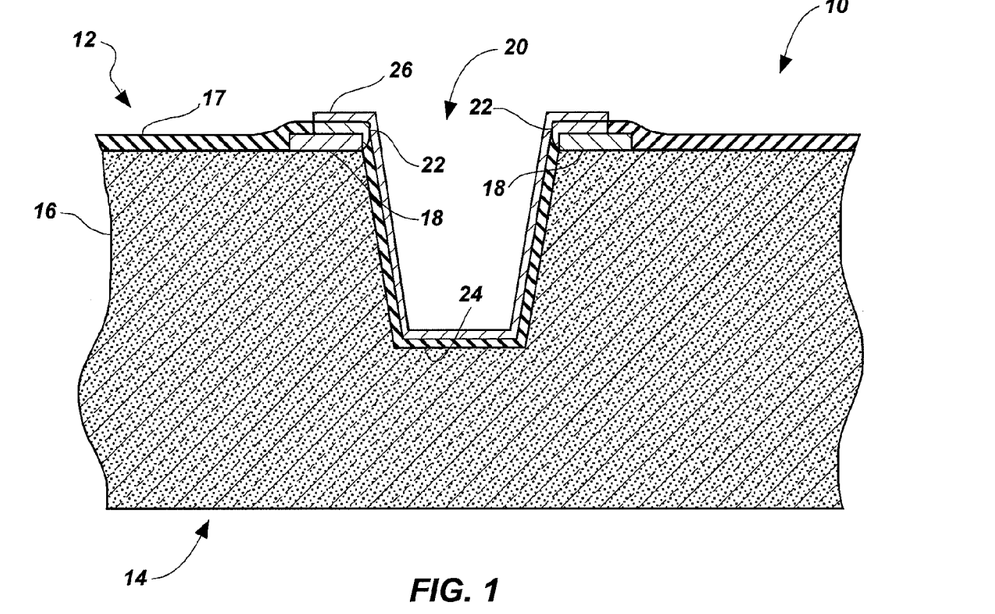
FIGS. 1-8 illustrate cross-sectional views of semiconductor devices at different stages of fabrication, including the formation of through-wafer interconnect structures, in accordance with certain aspects of the present invention.

Referring now to FIGS. 1-8, methods and structures in accordance with an embodiment of the present invention are disclosed. FIG. 1 illustrates a cross-section of a semiconductor device 10 having a first surface 12 and an opposing, second surface 14 in accordance with an example of one embodiment of the invention. The semiconductor device 10 comprises a semiconductor substrate 16 (i.e., a silicon substrate) and optionally may include a dielectric layer (not shown), a passivation layer 17 or conductive elements including bond pads 18 which may be coupled with internal circuitry (not shown) as will be appreciated by those of ordinary skill in the art.

The substrate 16 may comprise, without limitation, a bulk semiconductor substrate (e.g., a full or partial wafer of a semiconductor material, such as silicon, gallium arsenide, indium phosphide, polysilicon, a silicon-on-insulator (SOI) type substrate, such as silicon-on-ceramic (SOC), silicon-on-glass (SOG), silicon-on-sapphire (SOS), or a polymeric material suitable for semiconductor fabrication, etc., that may include a plurality of semiconductor dice or other semiconductor devices formed therein. If the substrate 16 is a wafer, the substrate 16 may also be a full thickness wafer as received from a vendor or a wafer that has been thinned (e.g., thereby defining the second surface 14) after fabrication of the semiconductor device 10. While not specifically illustrated, the semiconductor device 10 may further include, or be further processed to include, various conductive elements, active areas or regions, transistors, capacitors, redistribution lines, or other structures used to produce integrated circuitry. The TWIs of the present invention may be formed at the semiconductor die level or at the wafer (or other bulk substrate) level, depending on the particular needs of the manufacturing process. Thus, while FIGS. 1-8 illustrate the fabrication of a single TWI in association with a single bond pad 18 (shown as two cross-sectional portions in the drawings), it should be understood that the semiconductor device 10 may be constructed to include multiple TWIs and that such TWIs may be associated with internal circuitry (not shown) or may be formed in "dead space" of the substrate 16. Further, as illustrated in FIG. 1, and depending on the type of process used to place the bond pad 18 on the semiconductor device 10, the bond pad 18 may be partially covered with a passivation layer 17. As will be appreciated by those of ordinary skill in the art, the passivation layer 17 may include an appropriate layer of insulative or dielectric material disposed on a surface of the substrate 16 to prevent oxidation of the semiconductive material.

As shown in FIG. 1, an aperture 20, formed as a blind hole in the presently disclosed embodiment, is formed in the first surface 12 of the semiconductor device 10. In one embodiment, the aperture 20 is patterned and etched through the bond pad 18 and into the substrate 16. The aperture 20 may be formed by appropriately masking and patterning a photoresist or other material (e.g., oxide hard mask), and wet or dry etching to form the aperture 20 to a predetermined depth suitable for the formation of the TWI such as, for example, deep silicon etched vias. One suitable "wet" metal etch employs a mixture of nitric acid and hydrofluoric (HF) acid in deionized (DI) water. "Dry" etching may also be termed reactive ion etching (RIE). Either a wet or dry etchant may be used to form the aperture 20, as well as to etch through the bond pad 18 (and other materials above the substrate 16, if present). Further, if the substrate 16 is made from silicon, a silicon dioxide native oxide may require removal, and an HF etchant may be used for this purpose prior to etching of the underlying silicon of the substrate 16. In other embodiments, the aperture 20 may be formed, for example, by laser drilling, laser ablation or mechanical drilling. After formation, the aperture 20 may be subjected to a cleaning process to remove any unwanted reactants or impurities formed during the aperture formation process.

After the aperture 20 is formed, a metallized or other conductive layer 22 may be formed on a portion of the bond pad 18. The conductive layer 22 may provide increased material adhesion between the bond pad 18 and a subsequent conductive material such as a metal liner or a material plating. For example, if the bond pad 18 were formed of a material such as aluminum, and if a subsequent conductive layer 22 of material comprised nickel, the conductive layer 22 may be disposed on the bond pad 18 to ensure the adherence of the nickel plating.

Still referring to FIG. 1, an insulation layer 24 is applied to the inner surface of the aperture 20. The insulation layer 24 may comprise a dielectric material such as, for example, a pulsed deposition layer (PDL) of low silane oxide (LSO), a PARYLENE™ polymer such as that which is available from Specialty Coating Systems division of Cookson Electronics, Providence, R.I., silicon dioxide ($SiO_2$), aluminum oxide ($Al_2O_3$), an organic polymeric material suitable for passivation purposes such as polybenzoxazole (PBO) or benzocyclobutene (BCB), or combinations of any thereof. Other dielectric materials that may be used as the insulation layer 24 include tetraethyl orthosilicate (TEOS), spin-on glass, thermal oxide, a pulse deposition layer comprising aluminum rich oxide, silicon nitride, silicon oxynitride, a glass (i.e., borophosphosilicate glass (BPSG), phosphosilicate glass, borosilicate glass), or any other suitable dielectric material known in the art. Methods of depositing the insulation layer 24 are known by those of ordinary skill in the art and may vary depending on the type of material used for the insulation layer 24.

A conductive layer 26 is deposited over the insulation layer 24 and may be partially disposed over the first surface 12 of the semiconductor device 10 in a manner circumscribing the aperture 20. The conductive layer 26 comprises at least one layer of a conductive material such as, for example, nickel (Ni).

In one embodiment, the conductive layer 26 may include another layer such as a plating-attractive coating (PAC) or some type of seed layer that is placed over the insulation layer 24 to enhance the deposition of the conductive layer 26. For instance, titanium nitride (TiN) may be placed over the insulation layer 24 using chemical vapor deposition (CVD) techniques to act as the PAC for the subsequent deposition of the seed layer with a plating process such as, for example, electroless or electrolytic plating to form the conductive layer 26.

Other conductive materials that may be used to form the conductive layer 26 include, without limitation, titanium (Ti), polysilicon, palladium (Pd), tin (Sn), tantalum (Ta), tungsten (W), cobalt (Co), copper (Cu), silver (Ag), aluminum (Al), iridium, gold (Au), molybdenum (Mo), platinum (Pt), nickel-phosphorus (NiP), palladium-phosphorus (Pd—P), cobalt-phosphorus (Co—P), a Co—W—P alloy, other alloys of any of the foregoing metals, a conductive polymer or conductive material entrained in a polymer (i.e., conductive or conductor-filled epoxy) and mixtures of any thereof.

Other deposition processes that may be used to deposit the various layers of the conductive layer 26 include metallo-organic chemical vapor deposition (MOCVD), physical vapor deposition (PVD), plasma-enhanced chemical vapor deposition (PECVD), vacuum evaporation and sputtering. It will be appreciated by those of ordinary skill in the art that the type and thickness of material of the various layers or materials used for the conductive layer 26 and the deposition processes used to deposit the layers of the conductive layer 26 will vary depending on, for example, the electrical requirements and the type of desired material used to form the TWI and the intended use of the TWI.

Figure 2:
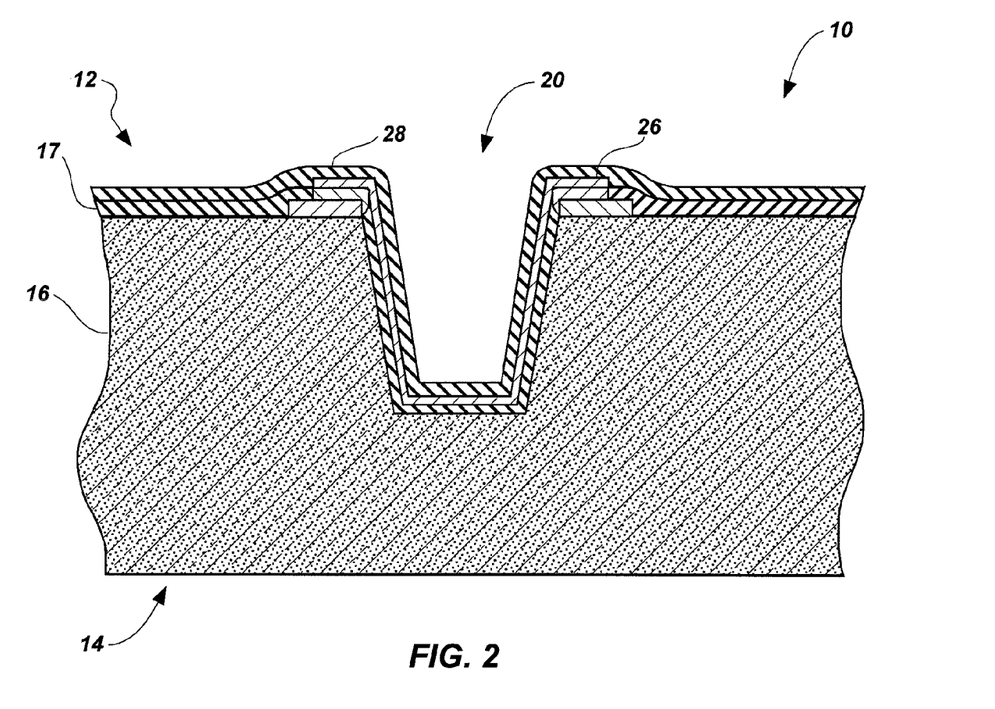

Referring now to FIG. 2, a second layer of insulation 28 is placed over the first surface 12 of the semiconductor device 10 and an interior surface of the aperture 20. In one embodiment, the second layer of insulation 28 may include PARYLENE™ polymer, but in other embodiments, the second layer of insulation 28 may include another dielectric material such as those discussed herein with reference to the insulation layer 24 of FIG. 1. Thus, the second layer of insulation 28 provides a non-solderable layer that conformally coats the interior surface of the aperture 20 and, as a result, flux clean, hot solder processes, and venting are not required as with prior art techniques of forming TWI structures.

The portion of the second layer of insulation 28, overlying the conductive layer 26 and the first surface 12 of the semiconductor device 10, is removed with a process such as, for example, spacer etching with a reactive ion (dry) etch. This results in the semiconductor device 10 structure shown in FIG. 3. In other embodiments, the portion of the second layer of insulation 28 may be removed using other processes including, but not limited to, chemical mechanical planarization (CMP), mechanical stripping, suitable masking and patterning of a photoresist along with wet or dry etching, or other known process. In one embodiment, when the second layer of insulation 28 comprises PARYLENE™ polymer, the second layer of insulation 28 may be masked, patterned and etched to remove the desired portions of the second layer of insulation 28 and expose the upper portions of the conductive layer 26, referred to herein as interconnecting pads 29, as illustrated in FIG. 3.

Figure 3:
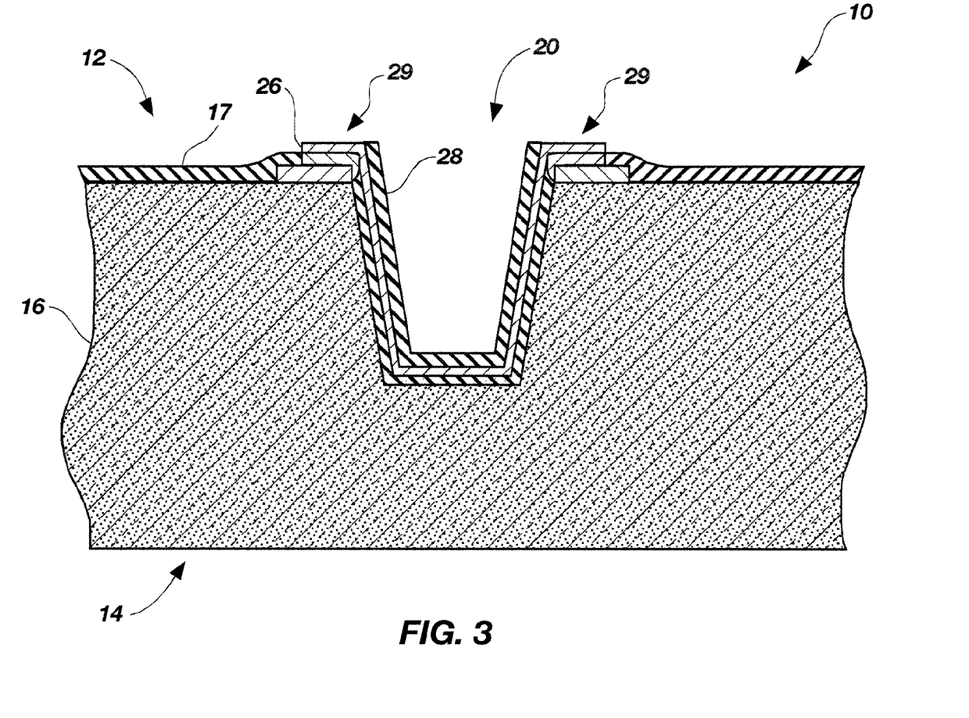
Figure 4:
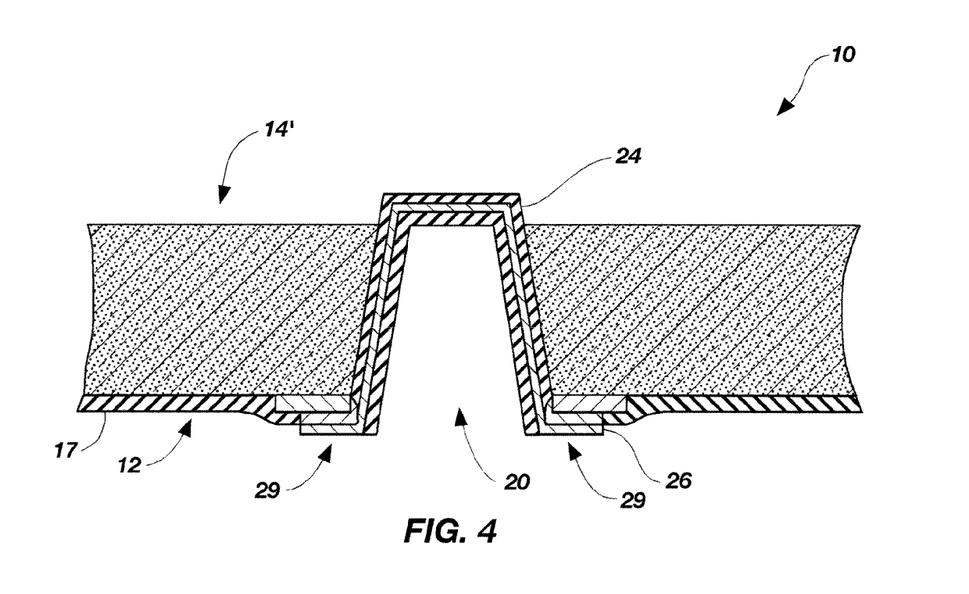

Referring now to FIG. 4, the semiconductor device 10 is depicted as having been inverted about a horizontal line relative to that of FIGS. 1-3 for convenience in describing subsequent process acts and resulting features. The semiconductor device 10 is thinned by removing a portion of the substrate 16 from the second surface 14 of the semiconductor device 10, resulting in a newly defined second surface 14'. The thinning of the semiconductor device 10 exposes the insulation layer 24 originally formed along the surface of the aperture 20 such that it extends partially through the second surface 14' of the semiconductor device 10. The substrate 16 may be thinned using any suitable process which may include, without limitation, an abrasive technique such as CMP or conventional back grinding, the use of a chemical to selectively etch the substrate 16, or suitable masking, patterning and etching of the second surface 14 (FIGS. 1-3) such as, for example, a patterned photoresist followed by a wet or dry etch to remove the substrate 16.

Figure 5:
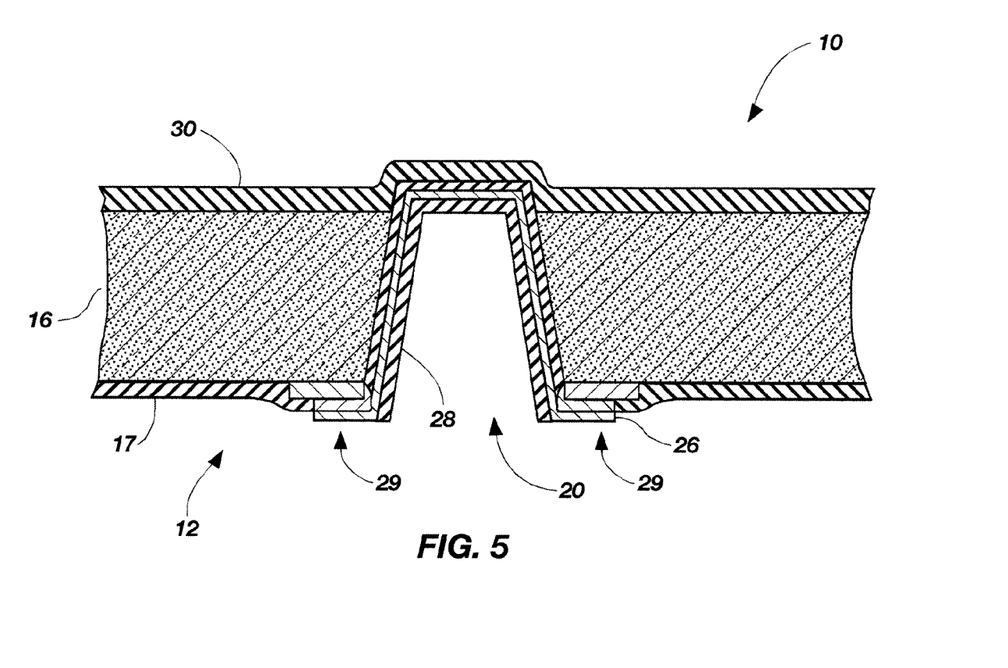

Referring now to FIG. 5, a third insulation layer 30 is deposited on the second surface 14' of the semiconductor device 10 and over the exposed portion of the insulation layer 24. In one embodiment, the third insulation layer 30 comprises a polymer such as a PARYLENE™ polymer, a PYRALIN® polymer (also known as PI-2611 polymer, available from DUPONT®), polybenzoxazole (PBO), benzocyclobutene (BCB), an insulative epoxy, a PDL of LSO, silicon dioxide ($SiO_2$), aluminum oxide ($Al_2O_3$), or any one of the materials used to form the insulation layer 24 described herein with reference to FIG. 1.

Figure 6:
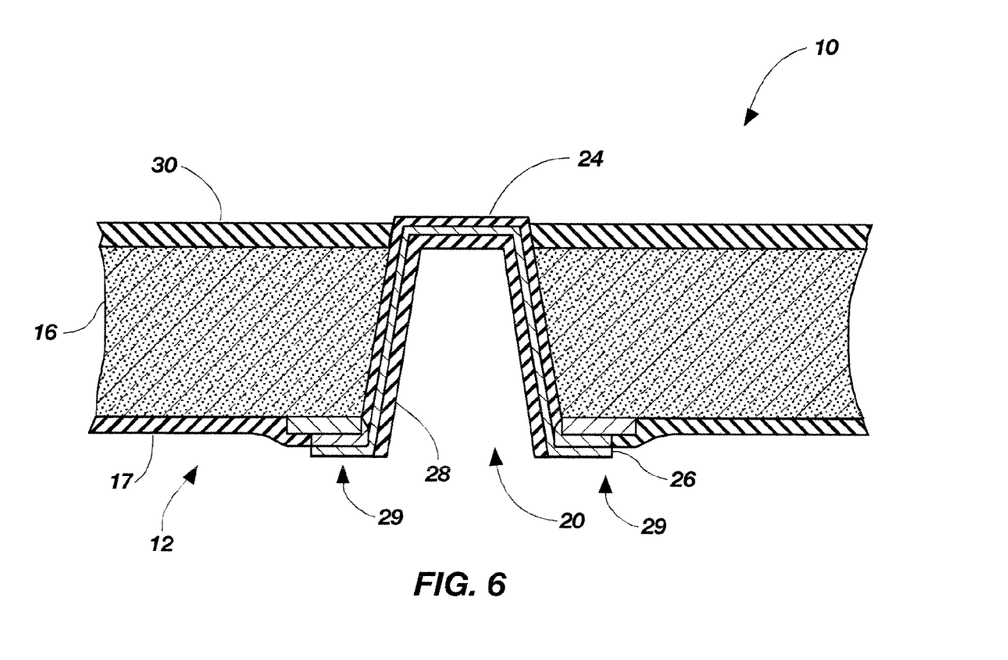

As shown in FIG. 6, a portion of the third insulation layer 30 is removed and a small portion of the insulation layer 24 is again exposed. The process used to remove the portion of the third insulation layer 30 overlying the insulation layer 24 is suitable for the type of material used as the third insulation layer 30. For instance, in an embodiment where PARYLENE™ polymer or PYRALIN® polymer is used as the third insulation layer 30, the process for removing the third insulation layer 30 may include masking and patterning a photoresist over the third insulation layer 30 and dry etching through the exposed portion of the third insulation layer 30, then stripping the photoresist.

In a further embodiment, if an insulative epoxy is used, a resist may be used to frame the epoxy pattern, the epoxy applied, and then the resist removed, leaving second surfaces 14' covered and insulation layer 24 exposed.

In another embodiment when PBO is used as the third insulation layer 30, the PBO may be selectively exposed, photodeveloped and baked to leave the protruding insulation layer 24 exposed.

In yet another embodiment, a stereolithography process (i.e., such as from Japan Science Technology Agency (JST)) may be used to selectively provide the third insulation layer 30 over the second surface 14' and leave the protruding insulation layer 24 exposed. In a further embodiment, a polymer may be dispersed in a pattern over the third insulation layer 30 using POLYJET™ technology from Objet Geometries Inc., Bellerica, Mass., to leave the insulation layer 24 exposed. In another embodiment, when LSO or PDL is used as the third insulation layer 30, CMP may be used to remove the portion of the third insulation layer 30 and expose the protruding insulation layer 24. Of course, other techniques, or various combinations of such techniques, may also be used to selectively remove portions of the third insulation layer 30 as will be appreciated by those of ordinary skill in the art.

Figure 7:
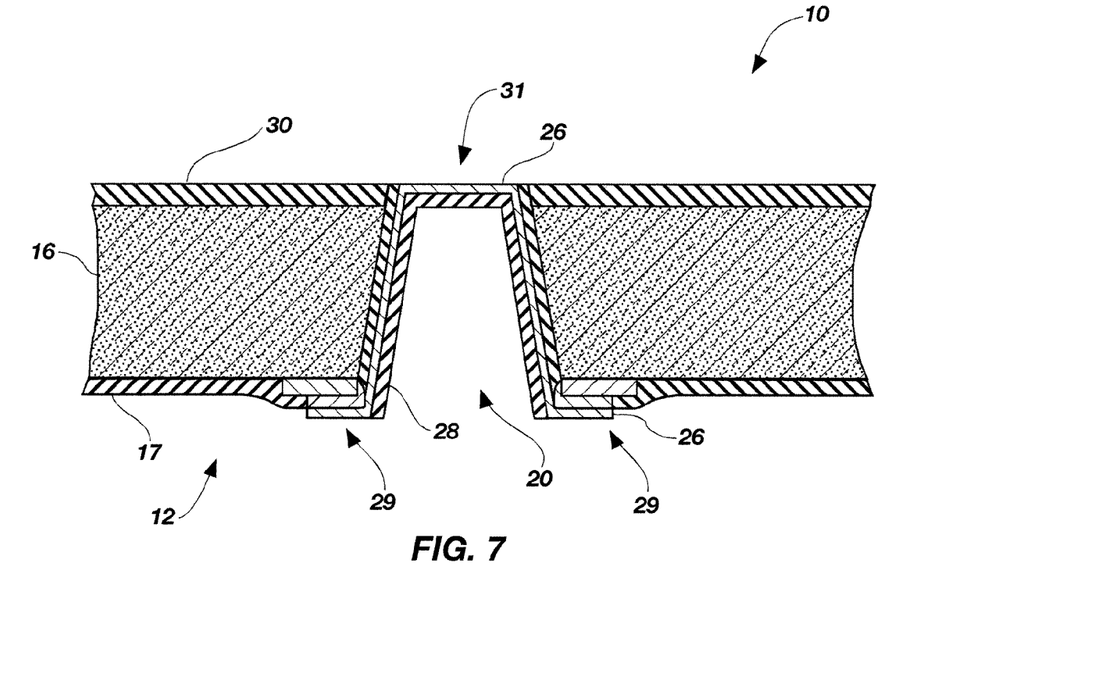

Referring now to FIG. 7, the protruding portion of insulation layer 24 is removed thereby exposing a portion of the underlying conductive layer 26, which may be referred to as an interconnecting pad 31. The protruding portion of the insulation layer 24 may be removed using any suitable process depending on the type of material used for the insulation layer 24. For instance, the protruding portion of the insulation layer 24 may be mechanically removed such as by mechanical abrasion or grinding, CMP, use of an etchant selective for the insulation layer 24 to etch away the insulation layer 24, or a suitable photolithography process may be used. With the portion of the conductive layer 26 being exposed, a TWI structure is formed wherein the interconnecting pads 29 and 31 are in electrical communication with one another and, further, are in electrical connection with the bond pad 18 (FIG. 1) of the semiconductor device 10. As previously discussed, the bond pad 18 may be in electrical communication with electrical circuitry formed in or on the substrate 16. In other embodiments, the resulting TWI structure may not be connected to any circuitry associated with the substrate 16, but may simply provide electrical interconnection of various external electrical components located on opposing sides of the substrate 16.

It is noted that, in some embodiments of the present invention, removal of the third insulation layer 30 and removal of the otherwise protruding portion of insulation layer 24 may be accomplished during the same act. However, depending on the underlying material from which the conductive layer 26 is formed, it may be desirable to remove a portion of the third insulation layer 30 and expose the interconnecting pad 31 of the conductive layer 26 in separate acts. For example, if the conductive layer 26 is formed of nickel, and a CMP process is used to remove the portion of the third insulation layer 30, such a process may not result in a uniform surface on the nickel interconnecting pad 31. Thus, a separate act, as described with respect to FIGS. 6 and 7, may be desired to expose the interconnecting pad 31.

Figure 8:
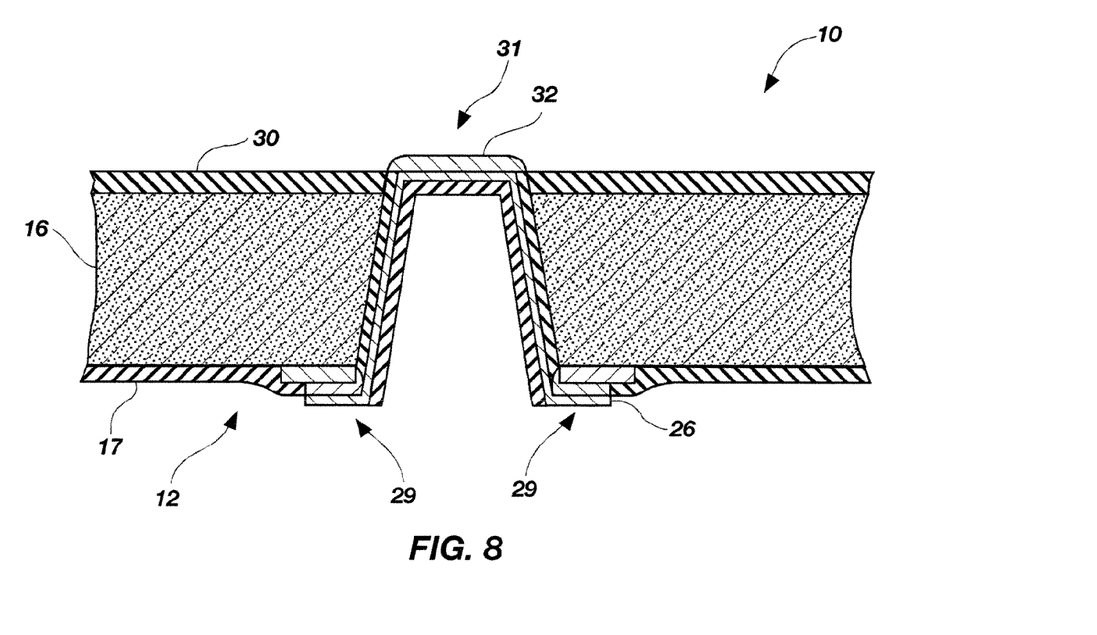

Referring now to FIG. 8, in one embodiment the exposed portion (or interconnecting pad 31) of conductive layer 26 may include one or more layers of a conductive material, such as a metal cap 32. The metal cap 32 may comprise, for example, nickel (Ni), gold (Au), a combination thereof, or any other conductive material compatible with the conductive layer 26 including those previously described herein with reference to the conductive layer 26. For instance, the metal cap 32 may be deposited with a plating process or other suitable process depending on the type of conductive material used for the metal cap 32.

In yet another embodiment, the aperture 20 may be filled with a conductive filler material. For example, the aperture 20 may be filled with tin (Sn), silver (Ag), copper (Cu), one of the materials that may be used for the conductive layer 26 previously described herein, any combination thereof, or other material used to fill vias or used to form a solid conductive via known in the art. Other filler materials include metal powder, a metal or alloy powder, a solder (for example, Pb/Sn or Ag/Sn), a flowable conductive photopolymer, a thermoplastic conductive resin, or resin-covered particulate metal material. Additionally, various processes may be used to fill the aperture 20 with conductive material including, for example, wave solder techniques, vacuum solder reflow techniques, or use of laser sphere techniques available from Pac Tech GmbH of Nauen, Germany to deposit solder balls in the aperture 20.

In an embodiment where the aperture 20 is filled with a conductive filler material, a portion of the insulation layer 24 may be removed using a suitable process such that the filler material is in electrical connection with the conductive layer 26. Additionally, the filler material may be configured to be in contact with, for example, the portions of the conductive layer 26 that have been defined herein as the interconnecting pads 29.

It is further noted that, when a conductive filler is used, the substrate 16 may be thinned to the point of allowing the filler to be exposed through the second surface 14' of the substrate 16, although such is not necessary due to the presence of the conductive layer 26 providing an interconnecting pad 31 on the second surface 14'.

Table 1 lists data obtained for various through-wafer interconnects (TWIs) produced in accordance with the presently disclosed invention. In one embodiment, the insulation layer 24 of the various TWIs comprises a PDL and the conductive layer 26 includes a PAC of Ta or W, a seed layer of Cu, and a liner of Ni of the indicated cross-sectional thicknesses.

TABLE 1

| Length of TWI (μm) | Diam. of TWI (μm) | TWI # | Insulation Layer PDL (μm) | PAC (μm) | Seed (μm) | Liner Ni (μm) | Filler | Pitch (μm) | R in mOhms | L in nH | C in pF |
|---|---|---|---|---|---|---|---|---|---|---|---|
| 150 | 50 | 1 | 1 | 0.15 Ta | 0.2 Cu | 3 | Sn/Ag/Cu | 132 | 8.61610 | 0.00620825 | 0.823725 |
| 150 | 50 | 1 | 1 | 0.15 Ta | 0.2 Cu | 3 | Air | 132 | 8.84410 | 0.00657425 | 0.824180 |
| 150 | 50 | 1 | 1 | 0.15 Ta | 0.2 Cu | 3 | Sn/Ag/Cu | 400 | 8.61075 | 0.00653200 | 0.826865 |
| 150 | 50 | 1 | 1 | 0.15 Ta | 0.2 Cu | 3 | Air | 400 | 8.84485 | 0.00688070 | 0.826435 |
| 150 | 50 | 4 | 1 | 0.3 W | 1.24 Cu | 5 | Sn/Ag/Cu | 132 | 6.07320 | 0.00631860 | 0.827275 |
| 150 | 50 | 4 | 1 | 0.3 W | 1.24 Cu | 5 | Air | 132 | 6.11580 | 0.00634805 | 0.8263700 |
| 150 | 50 | 4 | 1 | 0.3 W | 1.24 Cu | 5 | Sn/Ag/Cu | 400 | 6.08490 | 0.00659365 | 0.826830 |

The methods described herein, with regard to FIGS. 1-8, may be used to form TWIs in various semiconductor devices. The TWIs may have conventional sizes, such as diameters of about 15 μm or greater and lengths of 150 μm or more, as well as smaller TWIs applicable to enhanced miniaturization of future semiconductor devices. Of course, smaller diameter TWIs may be formed in thinner substrates and desired aspect ratios of the TWIs may be achieved by selection of an appropriate etch chemistry for the substrate material. Other considerations, such as physical strength of the substrate as it becomes thinner and the depth to which integrated circuitry extends into the substrate material may be significant factors in the depth and width of a TWI which may be formed according to the invention, rather than the process of the present invention itself. The semiconductor devices may be further configured with a redistribution layer comprising traces and, optionally, associated discrete external conductive elements formed thereon such as solder bumps, conductive epoxy or a conductor-filled epoxy, which may be disposed or formed on one of the surfaces of the semiconductor device and electrically interconnected with the TWIs by traces or disposed directly on the TWI on conductive layer 26 or metal cap 32, by techniques known to those of ordinary skill in the art.

The TWIs produced in accordance with the present invention may also be used for subsequent connection to integrated circuitry, if desired. For instance, a higher-level packaging system may include semiconductor devices having TWIs produced with the method of the instant invention. For example, a PC board having a first semiconductor device and a second semiconductor device may be placed in a stacked arrangement utilizing the TWI structure of the present invention.

Figure 9:
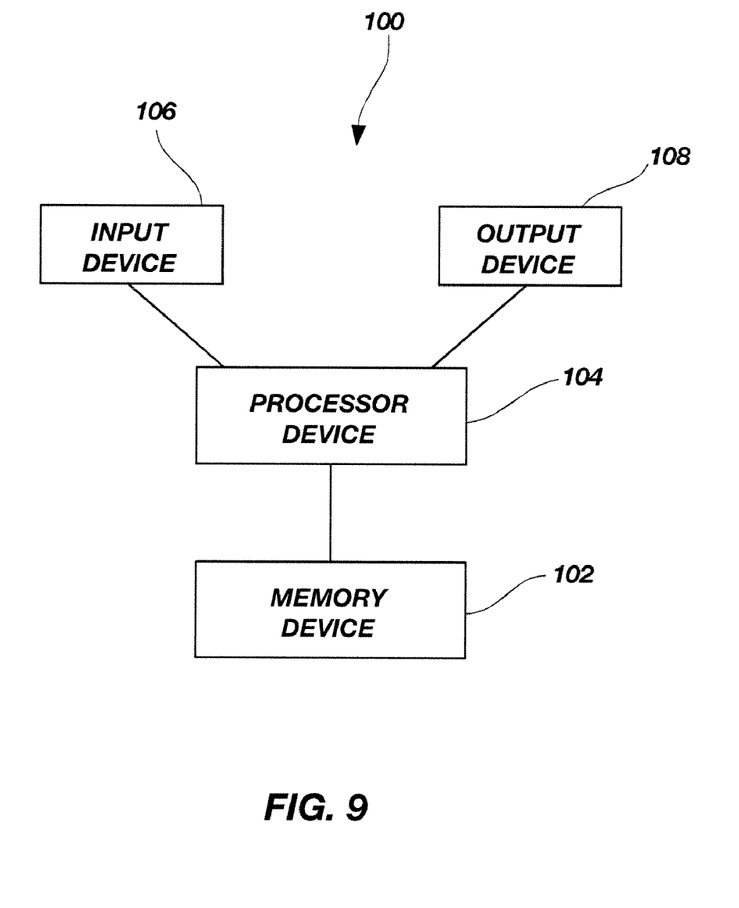
FIG. 9 is a schematic representation showing a computing system including a semiconductor device configured in accordance with the present invention.

It is further noted that the above-described semiconductor device 10, or other components incorporating one or more TWI structures of the present invention, may be utilized in a computer environment. For example, referring to FIG. 9, a semiconductor device may be incorporated into a computing system 100, which may include, for example, a memory device 102 (which may include any of a variety of random access memory devices, Flash memory or other types of memory devices) and a processor device 104, such as a central processing unit or other logic device, operably coupled with the memory device(s) 102. Either of the memory device 102 or the processor device 104 may be configured with a TWI structure in accordance with the present invention. The processor device 104 may also be coupled with one or more appropriate input devices 106 (e.g., mouse, keyboard, hard drive, microphone, etc.) and one or more output devices 108 (e.g., monitor, printer, speaker, etc.).

Although the foregoing description contains many specifics, these are not to be construed as limiting the scope of the present invention, but merely providing certain example embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A semiconductor device, comprising:
   a substrate having a first surface and a second, opposing surface;
   a through-wafer interconnect structure extending from the first surface to the second, opposing surface, the through-wafer interconnect comprising:
      an electrically conductive material extending from the first surface of the substrate to the second, opposing surface of the substrate, wherein a first portion of the electrically conductive material is exposed through the first surface of the substrate and a second portion of the electrically conductive material is exposed through the second, opposing surface of the substrate;
      a first dielectric material disposed between and adjacent to the electrically conductive material and the substrate and extending from the second, opposing surface of the substrate to the first portion of the conductive material and wherein the first dielectric material is at least substantially flush with the second portion of the electrically conductive material; and
      a second dielectric material disposed over a portion of the electrically conductive material and exhibiting a surface that defines a blind aperture extending from the first surface toward the second, opposing surface.

2. The semiconductor device of claim 1, further comprising a dielectric layer covering at least a portion of the second, opposing surface of the substrate.

3. The semiconductor device of claim 2, wherein the dielectric layer covering at least a portion of the second, opposing surface comprises at least one of PARYLENE™ polymer, PYRALIN® polymer, PBO, BCB, dielectric epoxy, low silane oxide, silicon dioxide, and aluminum oxide.

4. The semiconductor device of claim 1, further comprising a second electrically conductive material disposed on the second portion of the conductive material.

5. The semiconductor device of claim 4, wherein the second electrically conductive material comprises a material selected from the group consisting of nickel, titanium nitride, titanium, polysilicon, palladium, tin, tantalum, tungsten, cobalt, copper, silver, aluminum, iridium, gold, molybdenum, platinum, nickel-phosphorus, palladium-phosphorus, cobalt-phosphorus, and combinations of any thereof.

6. The semiconductor device of claim 1, further comprising a filler material disposed in the blind aperture defined by the surface of the second dielectric material.

7. The semiconductor device of claim 6, wherein the filler material is selected from a group consisting of nickel, titanium nitride, titanium, silicon nitride, polysilicon, palladium, tin, lead, tantalum, tungsten, cobalt, copper, silver, aluminum, iridium, gold, molybdenum, platinum, nickel-phosphorus, palladium-phosphorus, cobalt-phosphorus, and combinations of any thereof.

8. The semiconductor device of claim 1, wherein the electrically conductive material comprises a material selected from the group consisting of nickel, titanium nitride, titanium, silicon nitride, polysilicon, palladium, tin, tantalum, tungsten, cobalt, copper, silver, aluminum, iridium, gold, molybdenum, platinum, nickel-phosphorus, palladium-phosphorus, cobalt-phosphorus, conductive polymer and combinations of any thereof.

9. The semiconductor device of claim 1, wherein the first dielectric material comprises a material selected from the group consisting of a low silane oxide, PARYLENE™ polymer, PBO, BCB, silicon dioxide, aluminum oxide, tetraethyl orthosilicate, spin-on glass, thermal oxide, aluminum rich oxide, silicon nitride, silicon oxynitride, phosphosilicate glass, borosilicate glass, borophosphosilicate glass, and combinations of any thereof.

10. The semiconductor device of claim 1, wherein the second dielectric material comprises a material selected from the group consisting of a low silane oxide, PARYLENE™ polymer, PBO, BCB, silicon dioxide, aluminum oxide, tetraethyl orthosilicate, spin-on glass, thermal oxide, aluminum rich oxide, silicon nitride, silicon oxynitride, phosphosilicate glass, borosilicate glass, borophosphosilicate glass, and combinations of any thereof.

11. The semiconductor device of claim 1, wherein the substrate comprises a material selected from the group consisting of silicon, gallium arsenide, indium phosphide, polysilicon, silicon-on-insulator, silicon-on-ceramic, silicon-on-glass, silicon-on-sapphire, a polymer, and combinations of any thereof.

12. The semiconductor device of claim 1, wherein the through-wafer interconnect has a through-substrate length of about 150 µm or greater.

13. The semiconductor device of claim 1, wherein the through-wafer interconnect has a cross-sectional width of about 15 µm or greater.

* * * * *